US006507657B1

(12) United States Patent
Kamada et al.

(10) Patent No.: US 6,507,657 B1
(45) Date of Patent: Jan. 14, 2003

(54) STEREOPHONIC SOUND IMAGE ENHANCEMENT APPARATUS AND STEREOPHONIC SOUND IMAGE ENHANCEMENT METHOD

(75) Inventors: Kenji Kamada, Hamamatsu (JP); Akihiro Fujita, Hamamatsu (JP); Kouji Kuwano, Hamamatsu (JP)

(73) Assignee: Kabushiki Kaisha Kawai Gakki Seisakusho, Shizuoka-Ken (JP)

( * ) Notice: Subject to any disclaimer, the term of this patent is extended or adjusted under 35 U.S.C. 154(b) by 0 days.

(21) Appl. No.: 09/080,057

(22) Filed: May 15, 1998

(30) Foreign Application Priority Data

May 20, 1997 (JP) ........................................... 9-145871

(51) Int. Cl.$^{7}$ ............................ H04R 5/00; H03G 3/00

(52) U.S. Cl. ............................... 381/17; 381/1; 381/61

(58) Field of Search ............................... 381/1, 17, 61, 381/97

(56) References Cited

U.S. PATENT DOCUMENTS 5,642,427 A * 6/1997 Kratz et al. ................... 381/17
5,657,391 A * 8/1997 Jyosako ......................... 381/1
5,883,962 A * 3/1999 Hawks ........................... 381/1
5,912,975 A * 6/1999 Schott .......................... 381/17
6,111,958 A * 8/2000 Maher ........................... 381/17

FOREIGN PATENT DOCUMENTS

WO WO9416538 7/1994

* cited by examiner

*Primary Examiner*—Minsun Oh Harvey
*Assistant Examiner*—Laura A. Grier
(74) *Attorney, Agent, or Firm*—Christie, Parker & Hale, LLP

(57) ABSTRACT

A stereophonic sound image enhancement apparatus comprises a first filter for changing a phase of a left channel input signal in response to a frequency of the left channel input signal; a second filter for changing a phase of a right channel input signal in response to a frequency of the right channel input signal; a first calculating means for calculating a difference between the left channel input signal and the phase-changed signal derived from the second filter to thereby output the difference signal as a left channel output signal; and a second calculating means for calculating a difference between the right channel input signal and the phase-changed signal derived from the first filter to thereby output.the difference signal as a right channel output signal.

16 Claims, 11 Drawing Sheets

CIRCUIT ARRANGEMENT OF FIRST ORDER ALL-PASS FILTER 10a, OR 10b

CIRCUIT ARRANGEMENT OF ADDER 11a, OR 11b

CIRCUIT ARRANGMENT OF DELAY DEVICE 12a, OR 12b

CIRCUIT ARRANGEMENT OF ATTENUATIOR 13a, OR 13b

CIRCUIT ARRENGEMENT OF ADDER 14a, OR 14b

STEREOPHONIC SOUND IMAGE ENHANCEMENT APPARATUS AND STEREOPHONIC SOUND IMAGE ENHANCEMENT METHOD

BACKGROUND OF THE INVENTION

1. Field of the Invention

The present invention generally relates to a stereophonic sound image enhancement apparatus and a stereophonic sound image enhancement method, capable of enhancing a stereophonic sound image during a stereophonic sound reproducing operation. The apparatus and methods may be used in, for example, electronic music instruments, game machines, and acoustic appliances (for example, mixers). More specifically, the present invention is directed to a technique for enhancing stereophonic sound images during a 2-channel speaker reproducing operation.

2. Description of the Related Art

Several conventional sound image localizing techniques are known in this field. For example, in one technique, a left channel signal and a right channel signal for a stereophonic sound are produced and supplied to left/right speakers, respectively, to produce stereophonic sounds simultaneously so that a sound image is localized. Essentially, this conventional sound image localizing technique localizes the sound image by changing the balance in the sound volumes of the left/right channels. As a consequence, the sound image is localized only between the left speaker and the right speaker.

Another sound image localizing technique has been developed where a sound that a phase of a right-channel signal is inverted and is mixed with a left-channel signal and a phase of the left-channel signal is inverted and is mixed with the right-channel signal. As a consequence, the resulting sound image is localized at any position except for positions between the left speaker and the right speaker (namely, a left side, or a right side located apart from left/right speakers). This sound image localizing technique is disclosed in, for instance, "SOUND IMAGE MANIPULATION APPARATUS AND METHOD FOR SOUND IMAGE ENHANCEMENT" of WO94/16538 (PCT/US93/12688).

This conventional sound image manipulation apparatus/method for sound image enhancement produces a difference signal between a left-channel input signal and a right-channel input signal. The amplitude or magnitude of this difference signal is adjusted, and the adjusted difference signal is supplied to a band-pass filter. Then, the difference signal filtered by the band-pass filter is added to the left-channel input signal to produce the left-channel output signal. Similarly, the difference signal filtered from the band-pass filter is subtracted from the right-channel input signal to produce the right-channel output signal. The left-channel output signal and the right-channel output signal are supplied to the left speaker and the right speaker, respectively. According to the conventional sound image manipulation apparatus and sound image enhancement method, the sound image can be localized at any position except for positions between the left speaker and the right speaker. As a consequence, the stereophonic sound image is enhanced and a sound stage having excellent presence may be realized.

However, these sound image manipulation apparatus and sound image enhancement methods may have a problem in that when the enhancement effect of the stereophonic sound image is increased by controlling the amplitude of the difference signal the sound quality may be deteriorated. In the worst case, the sound quality would be deteriorated to such an extent that the inputted source could not be reproduced.

Also, the Schroeder method is known in this field as another technique capable of localizing the sound image at any position except for the position between the left speaker and the right speaker. In the Schroeder method, crosstalk sounds from the left speaker to a right ear and from the right speaker to a left ear are canceled. As a result, a listening condition using a headphone may be established. When the Schroeder localizing technique is introduced, the sound image can be localized at any arbitrary position such as positions immediately beside a listener, immediately behind a listener, and also between the left speaker and the right speaker.

However, if a sound image localization apparatus to which the basic idea of this Schroeder method has been strictly applied is constituted by an analog circuit, then a huge amount of hardware is necessarily required. On the other hand, if this sound image localization apparatus is arranged by a digitally-operated processor such as a digital signal processor (DSP) and a CPU, then a large amount of data processing operation is required. As a result, conventionally, the sound image localization apparatus with employment of the Schroeder method is allowed to be applied only to such a limited appliance, for instance, high-grade electronic musical instruments, game machines, and acoustic appliances.

SUMMARY OF THE INVENTION

As a consequence, the present invention has an object to provide a stereophonic sound image enhancement apparatus and a stereophonic sound image enhancement method, capable of enhancing a stereophonic sound image without deteriorating a sound quality during a 2-channel speaker reproducing operation. Furthermore, another object of the present invention is to provide a stereophonic sound image enhancement apparatus and a stereophonic sound image enhancement method, which can be made by a simple circuit arrangement and at low cost.

To achieve the above explained object, as indicated in FIG. 1, a stereophonic sound image enhancement apparatus, according to a first aspect of the present invention, includes:

- a first all-pass filter 10*a* for changing a phase of a left channel input signal Lin in response to a frequency of the left channel input signal Lin to thereby output a phase-changed left channel input signal;
- a second all-pass filter 10*b* for changing a phase of a right channel input signal Rin in response to a frequency of the right channel input signal Rin to thereby output a phase-changed right channel input signal;
- first calculating means 11*a* for calculating a first difference between the left channel input signal Lin and the phase-changed right channel input signal outputted from the second all-pass filter lob to thereby output a first difference signal corresponding to the first difference as a left channel output signal Lout; and
- second calculating means 11*b* for calculating a second difference between the right channel input signal Rin and the phase-changed left channel input signal outputted from the first all-pass filter 10*a* to thereby output a second difference signal corresponding to the second difference as a right channel output signal.

Each of the first all-pass filter 10*a* and the second all-pass filter may comprise by a first order all-pass filter. In general, this first order all-pass filter may not change the frequency characteristic of the input signal, but will change the phase characteristic thereof. For example, as indicated in FIG. 2, such a filter may be employed, by which the phase of the input signal is shifted by 180 degrees.

Each of the first calculating means 11*a* and the second calculating means 11*b* comprises, for example, an operational amplifier.

The first calculating means 11*a* subtracts the left channel input signal Lin from the phase-changed right channel input signal derived from the second all-pass filter 10*b* to obtain a first difference signal which is outputted as the left channel output signal Lout.

Similarly, the second calculating means 11*b* subtracts the right channel input signal Rin from the phase-changed left channel input signal derived from the first all-pass filter 10*a* to obtain a second difference signal which is outputted as the right channel output signal Rout.

Now, a consideration is made of such a case that both the first all-pass filter 10*a* and the second all-pass filter 10*b* are not employed. In this case, the first calculating means 11*a* subtracts the left channel input signal Lin from the right channel input signal Rin to obtain a difference signal, and then outputs this difference signal as the left channel output signal Lout. Similarly, the second calculating means 11*b* subtracts the right channel input signal Rin from the left channel input signal Lin to obtain another difference signal, and then outputs this difference signal as the right channel output signal Rout.

When sounds are produced based on the left-channel output signal Lout and the right-channel output signal Rout, lower sound ranges of the sounds are attenuated. The reason for this attenuation is as follows. Generally speaking, an audio signal (constructed of left channel input signal Lin and right channel input signal Rin) reproduced from a musical medium is processed in such a way that a listener can hear low-range-sounds of musical instruments such as a bass and a drum from a center position between a left speaker and a right speaker. This implies that the low sound range components contained in the audio signal in the left channel and the right channel have frequency characteristics similar to each other. As a consequence, when the left channel input signal Lin is subtracted from the right channel input signal Rin, the low sound range components substantially disappear. That is, the low sound ranges are attenuated.

To the contrary, as explained in the stereophonic sound image enhancement apparatus according to the first aspect of the present invention, the subtracting calculation comprises the difference between the input signal of one channel and the input signal of the other channel which has been filtered by the all-pass filter, so that the left channel input signal Lin and the right channel input signal Rin are produced. As a result, the attenuation in the low sound range can be avoided. This is because, as indicated in FIG. 2, the first order all-pass filter shifts the phase of the input signal by 90 degrees around the cut-off frequency "fc", and further shifts this phase by approximately 180 degrees (namely, reverse phase) while the frequency thereof is lowered. Conversely, this first order all-pass filter shifts the phase of this input signal by 0 degree (namely, normal phase) while the frequency thereof is increased. In other words, as to the first order all-pass filter, there is such a trend that the phase of the input signal is negatively inverted at frequencies lower than the cut-off frequency fc, so that the shifted phase of this input signal is outputted as the negative value. Conversely, there is another trend that the phase of the input signal is positively inverted at frequencies higher than the cut-off frequency, so that the shifted phase of this input signal is outputted as the positive value.

Accordingly, in the first calculating means 11*a* and the second calculating means 11*b*, the adding calculation is essentially carried out for the right/left channel input signals at a frequency range lower than the cut-off frequency fc, whereas the subtracting calculation is essentially carried out for the right/left channel input signals at a frequency range higher than the cut-off frequency fc. As a consequence, there is no possibility that the respective low sound range components contained in the left channel input signal Lin and the right channel input signal Rin are canceled by each other in the subtracting calculation. As a consequence, musical sounds with better sound qualities can be produced without attenuating the low sound ranges.

It should be noted that the transfer function of the first order all-pass filter is expressed by the following formula (1):

$$G_{(s)} = \frac{s - \omega_a}{s + \omega_a} \qquad \text{formula (1)}$$

where symbol "$\omega_a$"=2πf, symbol "s" is Laplace operator, and phase angle "θ"=−2 $\tan^{31\ 1}(\omega/\omega_a)$.

Also, as indicated in FIG. 3, a stereophonic sound image enhancement apparatus, according to a second aspect of the present invention, further includes:

first delay means 12*a* for delaying the first difference signal derived from the first calculating means 11*a* to thereby output a delayed first difference signal as a third difference signal;

third calculating means 14*a* for subtracting the left channel input signal Lin from the third difference signal derived from the first delay means 12*a* to obtain a difference signal which is outputted as a left channel output signal;

second delay means 12*b* for delaying the second difference signal derived from the second calculating means 11*b* to thereby output a delayed second difference signal as a fourth difference signal;

and fourth calculating means 14*b* for subtracting the right channel input signal Rin from the fourth difference signal derived from the second delay means 12*b* to obtain another difference signal which is outputted as a right channel output signal.

Both the first delay means 12*a* and the second delay means 12*b* produce an inter aural time difference. In the case that these first delay means 12*a* and second delay means 12*b* comprise a digital circuit, these delay means may be arranged by employing a delay buffer for delaying the input signal by a software process operation. The delay buffer, may comprise a cycle buffer which can write the data, while cycling within a preselected storage region.

On the other hand, when the first delay means 12*a* and the second delay means 12*b* comprise an analog circuit, these first/second delay means may comprise a first order all-pass filter or a second order all-pass filter, which functions as a group delay equalizer. This group delay equalizer ideally owns a flat group delay characteristic, which does not depend upon a frequency (see broken line shown in FIG. 4). However, as the frequency is increased, the large group delay is difficult to achieve in the analog circuit. On the other hand, it has been recognized that if the group delay is equalized up to approximately 2 kHz, then a sufficient sound image enhancement effect could be achieved. As a result, as this group delay equalizer, a group delay equalizer capable of realizing a group delay of, for example, approximately 180 μs corresponding to the inter aural time difference may be employed.

As one example, a formula (2) indicative of the group delay equalizer of 180 μs is expressed as follows:

$$G_2(s) = \frac{s^2 - 2\zeta\omega_0 s + \omega_0^2}{s^2 + 2\zeta\omega_0 s + \omega_0^2} \quad \text{formula (2)}$$

where symbol "$\omega_0$ " is an angular frequency at which the phase becomes 180 degrees, symbol "ζ" denotes an attenuation ratio ("ζ"=½Q), and symbol "ζ" represents Laplace operator (jω).

A solid line of FIG. 4 shows such a group delay characteristic of the first delay means 12*a* and the second delay means 12*b* when the angular frequency $\omega_0$ is selected to be approximately 3 kHz, and the attenuation ratio "ζ" is equal to 1 in the above-described equation (2). As is apparent from the graphic representation of FIG. 4, the substantially ideal group delay characteristic may be achieved up to about 2 kHz.

The inter aural time difference produced by the first delay means 12*a* and the second delay means 12*b* may constitute a major function so as to obtain the sound delay characteristics. Assuming now that these first delay means 12*a* and second delay means 12*b* are not employed, it may be possible to obtain sound delay characteristics to a certain extent. However, since the stereophonic sound image enhancement apparatus is equipped with these first delay means 12*a* and second delay means 12*b*, very large delay characteristics may be obtained. It should be noted that the sound image localizing/enhancing technique using the inter aural time difference produced by the first delay means 12*a* and the second delay means 12*b* is disclosed in U.S. Pat. No. 6,035,045, filed Oct. 17, 1997, by Akihiro Fujita, Kenji Kamada, and Kouji Kuwano, entitled "SOUND IMAGE LOCALIZATION METHOD AND APPARATUS, DELAY AMOUNT CONTROL APPARATUS, AND SOUND IMAGE CONTROL APPARATUS WITH USING DELAY AMOUNT CONTROL APPARATUS" in which priority is claimed based on Japanese Patent Application No. Heisei 8-298081. The disclosure of the above U.S. Pat. No. 6,035,045 is incorporated herein by reference.

The above-explained third calculating means 14*a* and fourth calculating means 14*b* may be constructed of, for instance, operational amplifiers. The third calculating means 14*a* is arranged to subtract the left channel input signal Lin from the delayed signal from the first delay means 12*a* and output the subtracted signal as a left channel output signal Lout. Similarly, the fourth calculating means 14*b* is arranged to subtract the right channel input signal Rin from the delayed signal from the first delay means 12*b* and output the subtracted signal as a right channel output signal Rout. The crosstalk components can be removed from the left channel input signal Lin and the right channel input signal Rin by the third calculating means 14*a* and the fourth calculating means 14*b*.

When sounds are produced using the left channel output signal Lout and the right channel output signal Rout produced in the above-explained manner, since the sound image can be localized at any position except for such a position between the left speaker and the right speaker, it is possible to obtain sound images extended to a further wide spreading range around the listener, as compared with the above-described stereophonic sound image enhancement apparatus according to the first aspect of the invention.

Also, as indicated in FIG. 5, a stereophonic sound image enhancement apparatus, according to a third aspect of the present invention, further includes:

first attenuating means 13*a* for attenuating the third difference signal derived from the first delay means 12*a* to supply an attenuated third difference signal as a fifth difference signal to the third calculating means 14*a*; and second attenuating means 13*b* for attenuating the fourth difference signal derived from the second delay means 12*b* to supply an attenuated fourth difference signal as a sixth difference signal to the fourth calculating means 14*b*.

Both the first attenuating means 13*a* and the second attenuating means 13*b* may comprise, for example, a variable resistor. In accordance with this arrangement, since the attenuation ratios in the first attenuating means 13*a* and the second attenuating means 13*b* may be varied, the spreading degree of the stereophonic sound image can be changed.

Also, a stereophonic sound image enhancement method, according to a fourth aspect of the present invention, comprises the steps of:

changing a phase of a left channel input signal in response to a frequency of the left channel input signal to output a phase-changed left channel input signal;

changing a phase of a right channel input signal in response to a frequency of the right channel input signal to output a phase-changed right channel input signal;

calculating a first difference between the left channel input signal and the phase-changed right channel input signal to output a first difference signal corresponding to the first difference as a left channel output signal; and calculating a second difference between the right channel input signal and the phase-changed left channel input signal to output a second difference signal corresponding to the second difference as a right channel output signal.

BRIEF DESCRIPTION OF THE DRAWINGS

A more complete understanding of the teachings of the present invention may be acquired by referring to the accompanying figures, in which.

DESCRIPTION OF THE PREFERRED EMBODIMENTS

Figure 1:
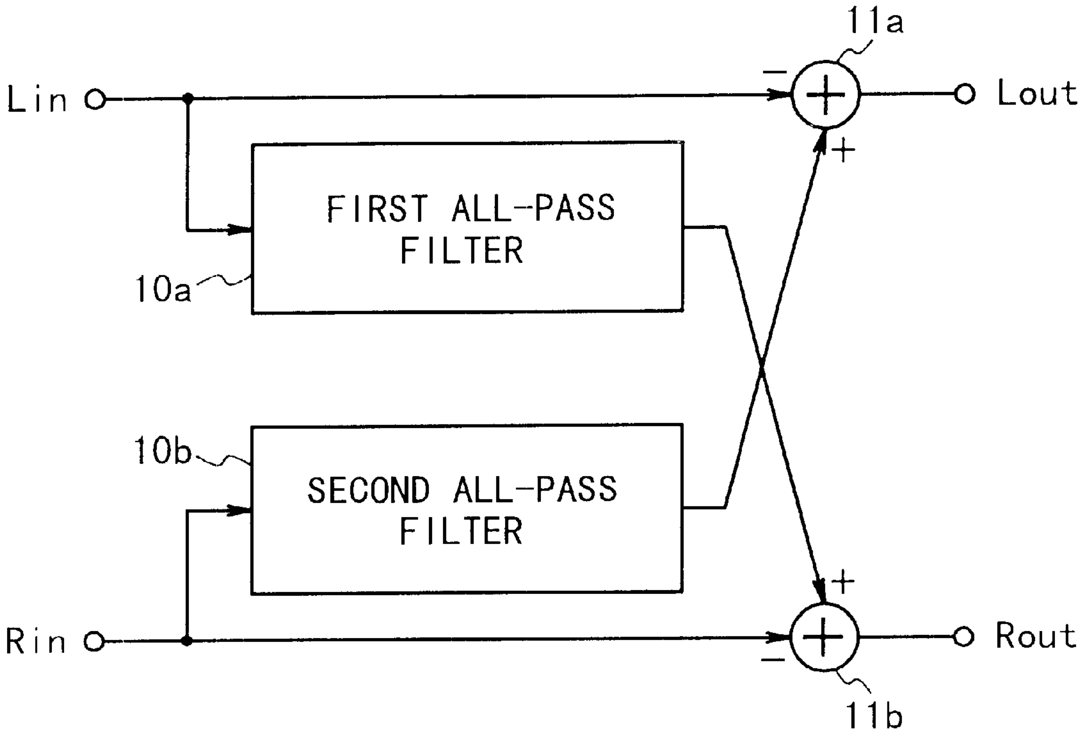
FIG. 1 is a schematic block diagram for representing an arrangement of a stereophonic sound image enhancement apparatus according to a first aspect of the present invention.
Figure 2:
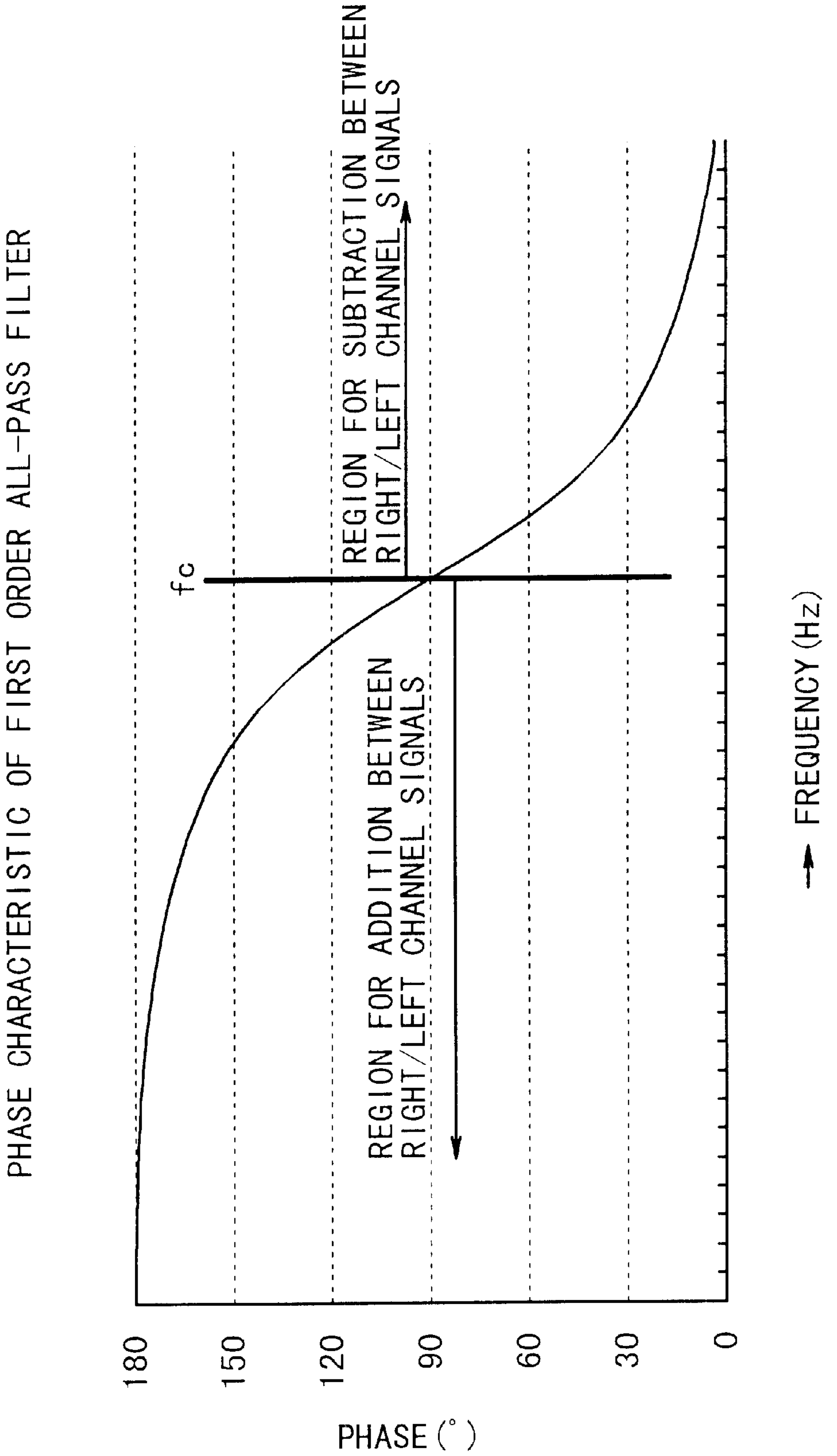
FIG. 2 graphically represents a phase characteristic of first and second all-pass filters employed in the stereophonic sound image enhancement apparatus according to the first aspect of FIG. 1.
Figure 3:
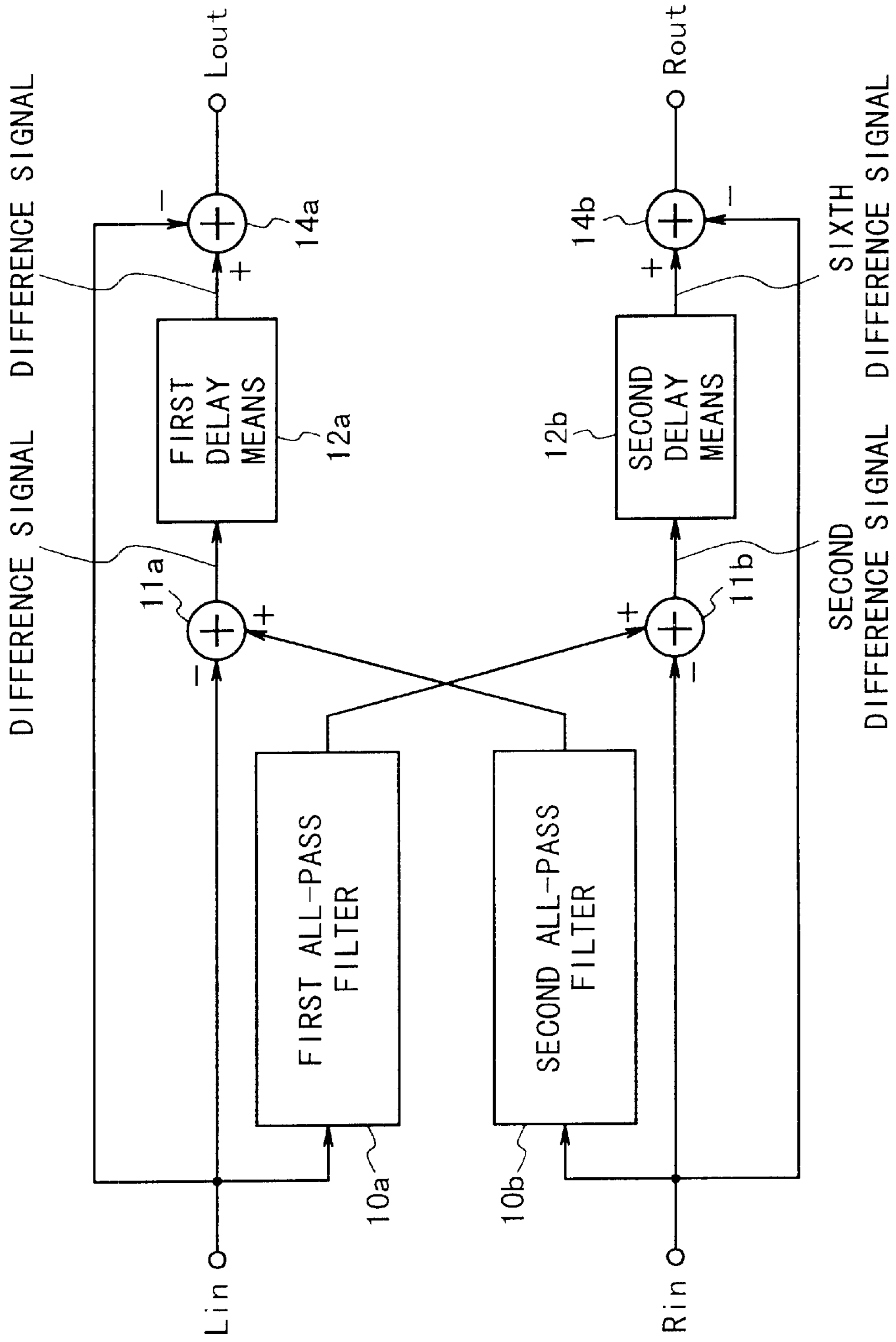
FIG. 3 is a schematic block diagram for showing an arrangement of a stereophonic sound image enhancement apparatus according to a second aspect of the present invention.
Figure 4:
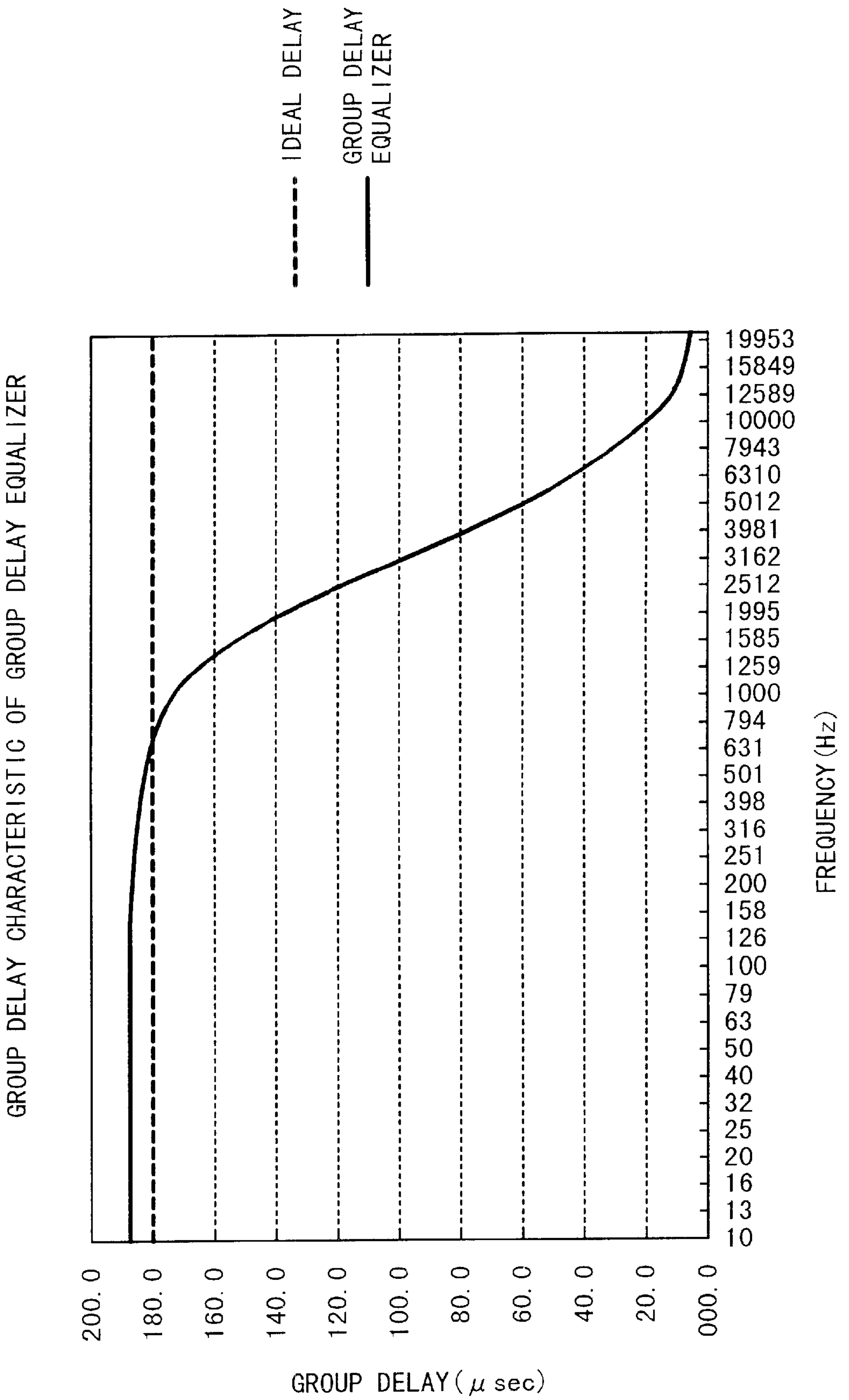
FIG. 4 graphically shows a group delay characteristic of first and second delay means employed in the stereophonic sound image enhancement apparatus according to the second aspect of FIG. 3.
Figure 5:
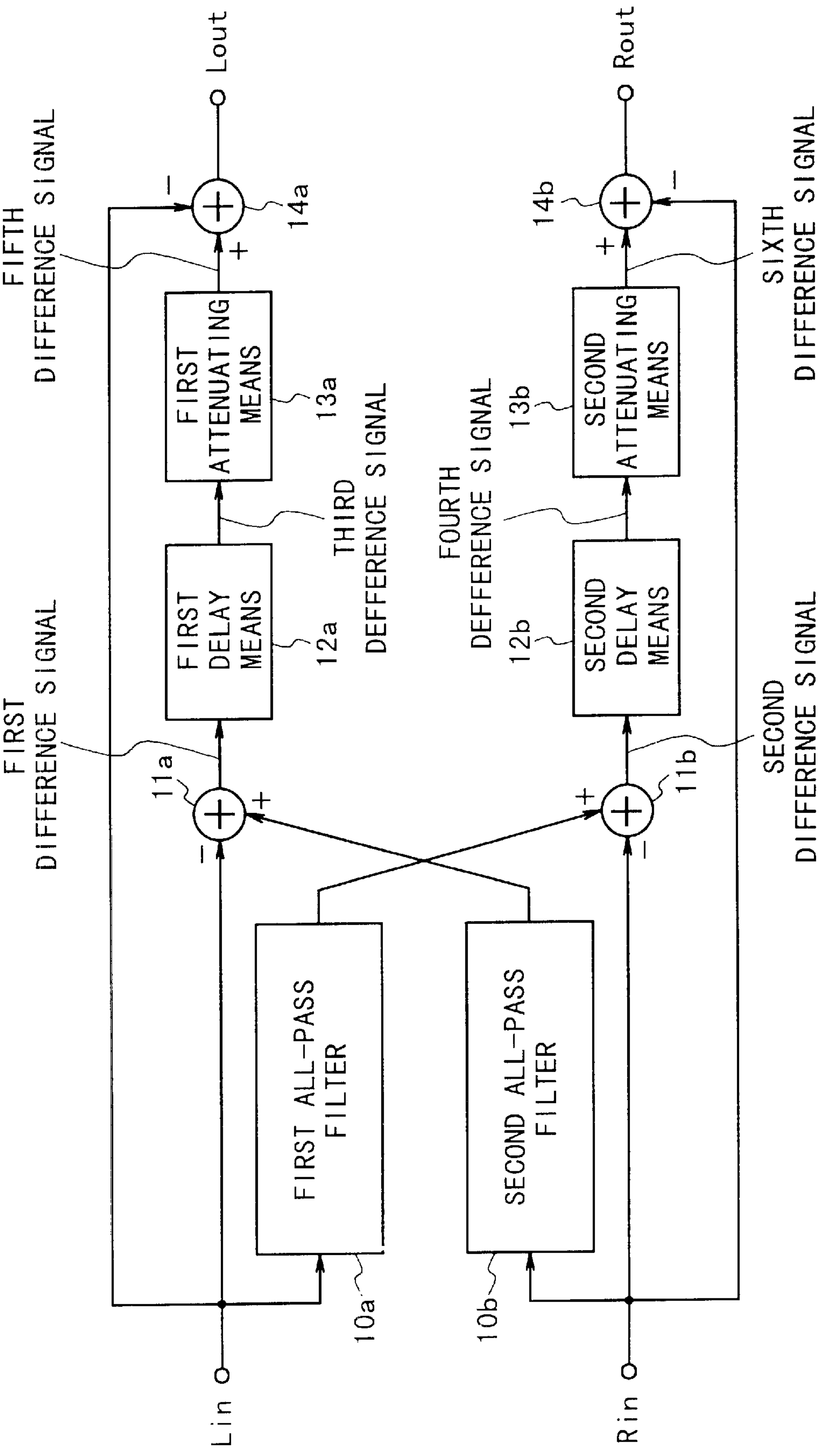
FIG. 5 is a schematic block diagram for indicating a stereophonic sound image enhancement apparatus according to a third aspect of the present invention.

Referring now to the drawings, a stereophonic sound image enhancement apparatus according to an embodiment of the present invention will be described in detail.

Figure 6:
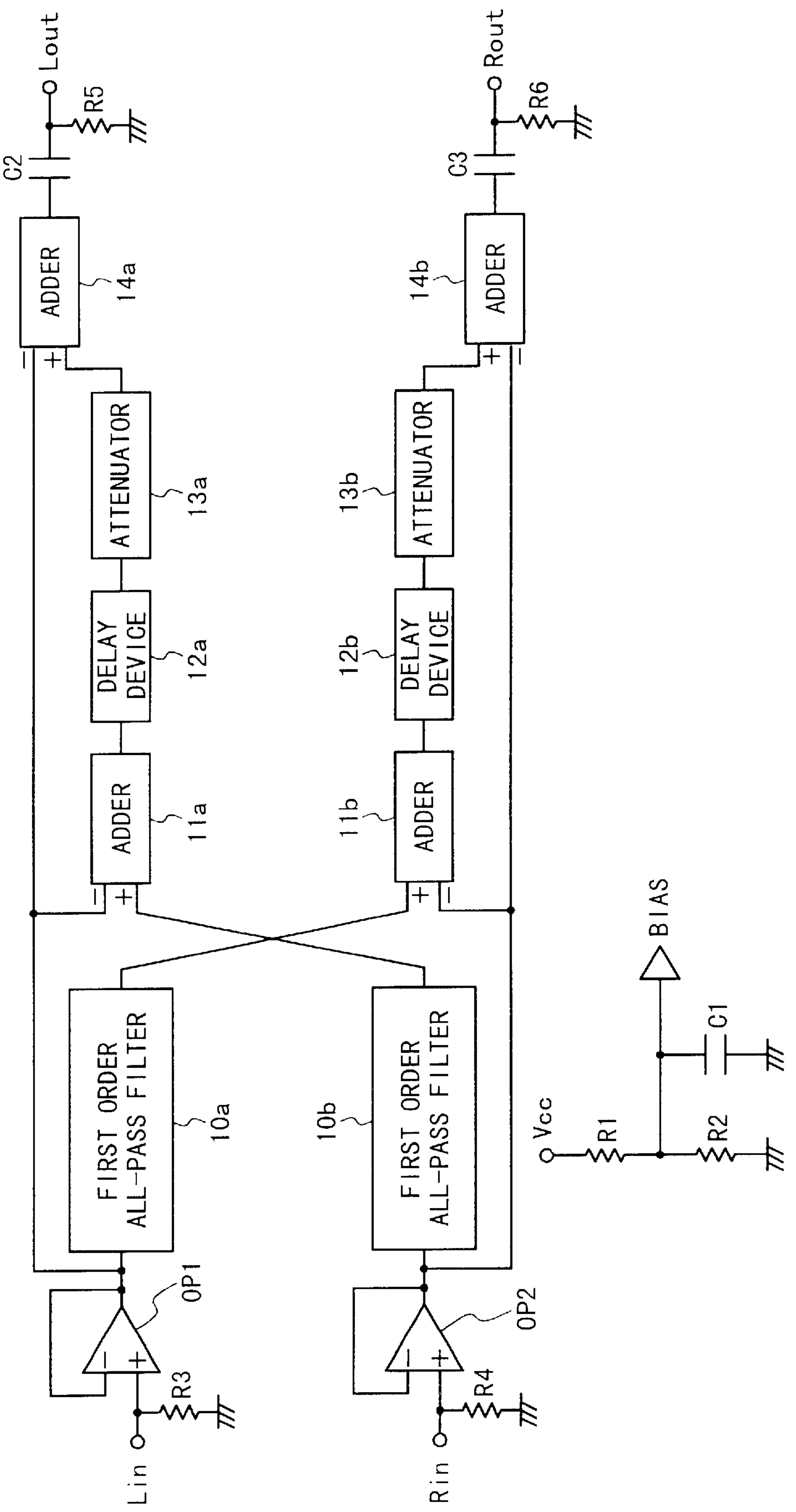
FIG. 6 is a schematic block diagram for representing an arrangement of a stereophonic sound image enhancement apparatus according to an embodiment of the present invention.

FIG. 6 is a schematic block diagram representing an arrangement of a stereophonic sound image enhancement apparatus according to one preferred embodiment of the present invention. A stereophonic input signal (precisely speaking, a left-channel input signal "Lin" and a right-channel input signal "Rin") is externally input into this stereophonic sound image enhancement apparatus. DC electric power is supplied from a power supply apparatus, for instance, an AC-DC converter, a cell, and the like (not shown) to the stereophonic sound image enhancement apparatus. A DC voltage Vcc of the power supply is subdivided by a resistor R1 and another resistor R2 to produce a bias voltage BIAS. This bias voltage BIAS is applied to the respective circuit elements of the stereophonic sound image enhancement apparatus.

A buffer circuit constructed of a resistor R3 and an operational amplifier OP1 receives the left-channel input signal Lin. Similarly, another buffer circuit constructed of a resistor R4 and an operational amplifier OP2 receives the right-channel input signal Rin. These buffer circuits eliminate noise components contained in the left-channel input signal Lin and the left-channel input signal Rin. A signal outputted from the operational amplifier OP1 is supplied to a first order all-pass filter 10*a*, an adder 11*a*, and another adder 14*a*. Also, a signal outputted from the operational amplifier OP2 is supplied to a first order all-pass filter 10*b*, an adder 11*b*, and another adder 14*b*.

Figure 7:
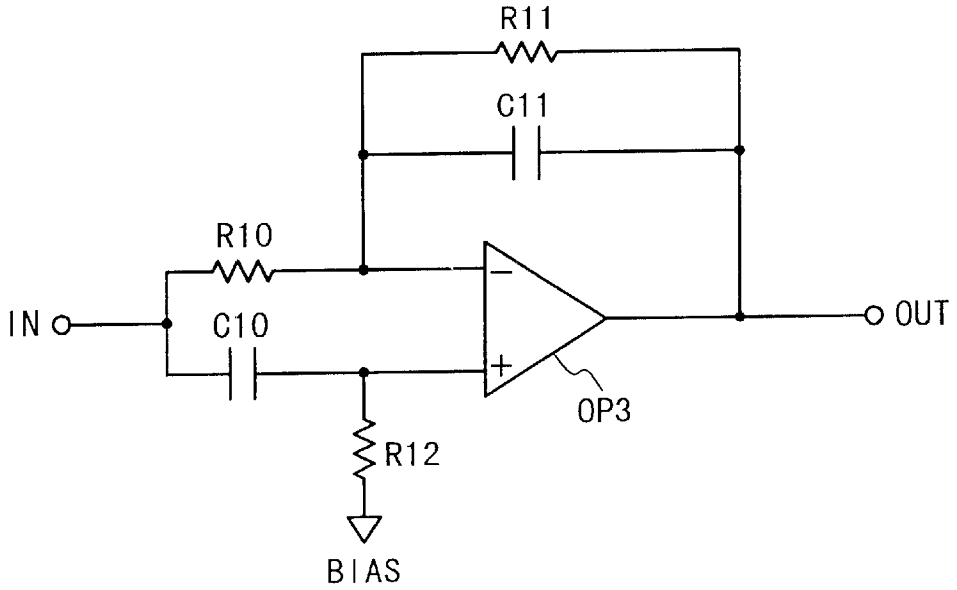
FIG. 7 is a circuit diagram of first order all-pass filters 10*a* and 10*b* employed in the stereophonic sound image enhancement apparatus of FIG. 6.

The first order all-pass filter 10*a* comprises the same circuit arrangement as that of the first order all-pass filter 10*b*, which is shown in detail in FIG. 7. Each of the first order all-pass filters 10*a* and 10*b* is arranged by resistors R10 to R12, capacitors C10 and C11, and an operational amplifier OP3. An input signal IN is supplied via the resistor R10 to an inverting input terminal (−) of 10 the operational amplifier OP3, and also is supplied via the capacitor C10 to a non-inverting input terminal (+) of this operational amplifier OP3. The bias voltage BIAS is supplied to the non-inverting input terminal (+) via the register R12. A signal derived from the operational amplifier OP3 is externally outputted as an output signal OUT, and also is fed back via the resistor R11 and the capacitor C11 to the inverting input terminal. A signal outputted from the first order all-pass filter 10*a* is supplied to the adder 11*b*, and a signal outputted from the first order all-pass filter 10*b* is supplied to the adder 11*a*.

The adders 11*a* and 11*b* correspond to first calculating means and second calculating means respectively. The adder 11*a* is connected so as to subtract the signal of the operational amplifier OP1 from the signal of the first order all-pass filter 10*b*. The adder 11*b* is connected so as to subtract the signal of the operational amplifier OP2 from the signal of the first order all-pass filter 10*a*.

Figure 8:
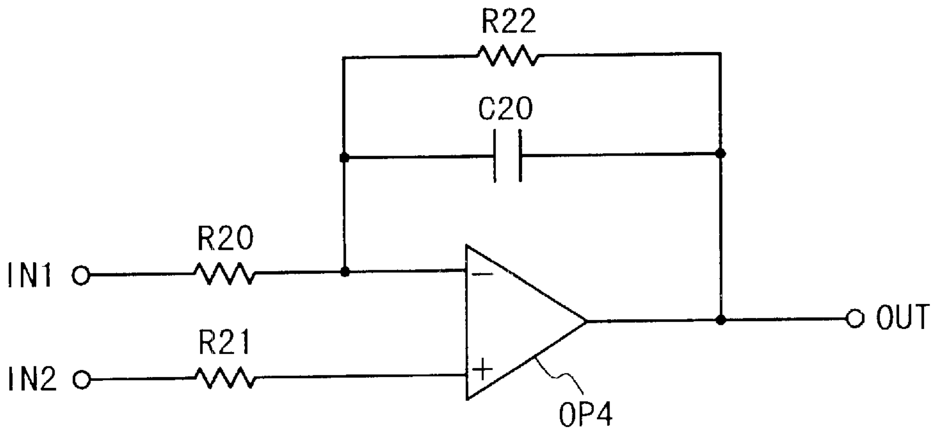
FIG. 8 is a circuit diagram of adders 11*a* and 11*b* employed in the stereophonic sound image enhancement apparatus of FIG. 6.

The adder 11*a* comprises the same circuit arrangement as that of the adder 11*b*, which is shown in detail in FIG. 8. Each of the adders 11*a* and 11*b* comprise resistors R20 to R22, a capacitor C20, and an operational amplifier OP4. One input signal IN1 is supplied via the resistor R20 to an inverting input terminal (−) of the operational amplifier OP4, and another input signal IN2 is supplied via the registor R21 to a non-inverting input terminal (+) of the operational amplifier OP4. A signal derived from the operational amplifier OP4 is externally outputted as an output signal OUT, and also is fed back via the resistor R22 and the capacitor C20 to the inverting input terminal. A signal outputted from the adder 11*a* is supplied to a delay device 12*a*, and a signal outputted from the adder 11*b* is supplied to another delay device 12*b*.

The delay devices 12*a* and 12*b* correspond to first delay means and second delay means, respectively. The delay device 12*a* delays the signal derived from the adder 11*a* by a predetermined time to output the delayed signal. The delay device 12*b* delays the signal derived from the adder 11*b* by predetermined time to output the delayed signal. Both the delay device 12*a* and the delay device 12*b* may comprise a first order all-pass filter functioning as a group delay equalizer.

Figure 9:
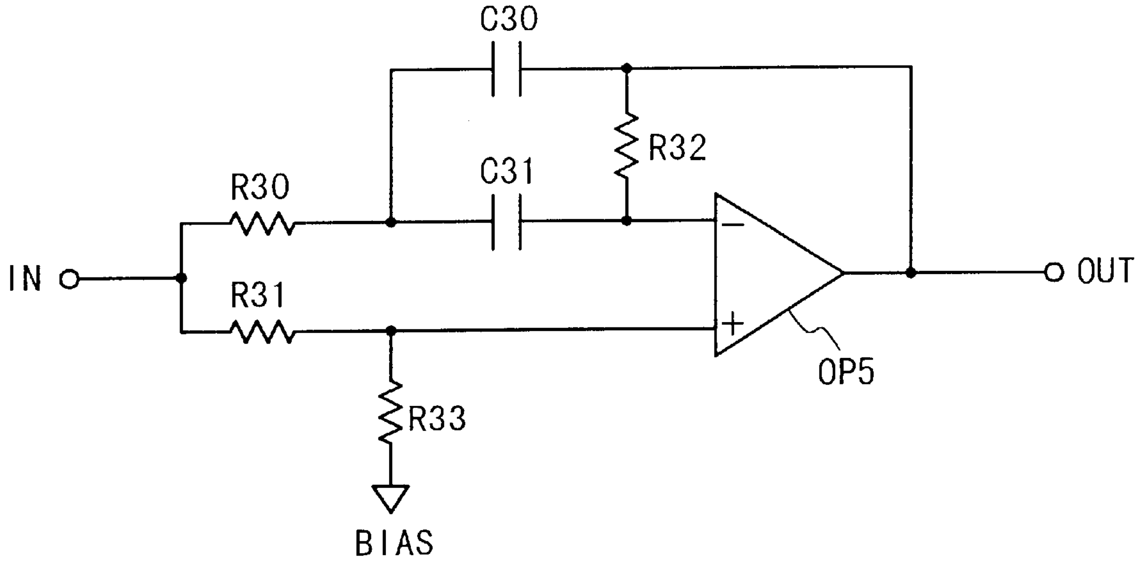
FIG. 9 is a circuit diagram of delay devices 12*a* and 12*b* employed in the stereophonic sound image enhancement apparatus of FIG. 6.

The delay device 12*a* comprises the same circuit arrangement as that of the delay device 12*b*, which is shown in detail in FIG. 9. Each of the delay devices 12*a* and 12*b* comprises resistors R30 to R33, capacitors C30 and C31, and an operational amplifier OP5. An input signal IN is supplied via the resistor R30, and a series/parallel circuit (see FIG. 9) constructed of the capacitor C30, the resistor R32, and the capacitor C31 to an inverting input terminal (−) of the operational amplifier OP5. The input signal IN also is supplied via the resistor R31 to a non-inverting input terminal (+) of the operational amplifier OPs. The bias voltage BIAS is supplied to the non-inverting input terminal (+) via the resistor R33. A signal derived from the operational amplifier OP5 is externally outputted as an output signal OUT, and also is fed back via the resistor R32 to the inverting input terminal. A signal outputted from the delay device 12*a* is supplied to an attenuator 13*a* and a signal outputted from delay device 12*b* is supplied to an attenuator 13*b*.

Figure 10:
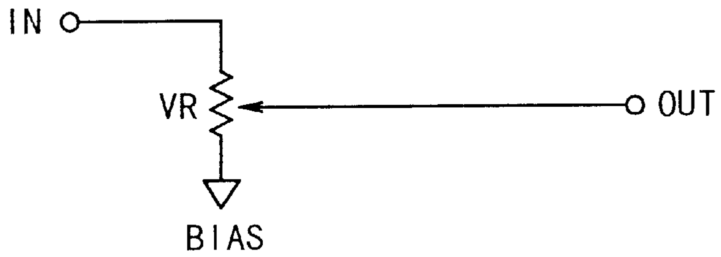
FIG. 10 is a circuit diagram of attenuators 13*a* and 13*b* employed in the stereophonic sound image enhancement apparatus of FIG. 6.

The attenuators 13*a* and 13*b* correspond to first attenuating means and second attenuating means, respectively. The attenuator 13*a* attenuates the signal derived from the delay device 12*a* to output the attenuated signal. The attenuator 13*b* attenuates the signal derived from the delay device 12*b* to output the attenuated signal. The attenuator 13*a* comprises the same structure as that of the attenuator 13*b*, which is indicated in FIG. 10 in more detail. Attenuators 13*a* and 13*b* may comprise, for instance, a variable resistor VR made of a resistive element and a slider. The signal outputted from the delay device 12*a* or 12*b* is supplied to one end of the resistive element of this variable resistor VR, whereas the bias voltage BIAS is applied to the other end of this resistive element. Then, the attenuated signal is derived from the slider. The signal derived from the attenuator 13*a* is supplied to the adder 14*a*. The signal derived from the attenuator 13*b* is supplied to the adder 14*b*. In accordance with this arrangement, for example, the attenuation ratios of the attenuators 13*a* and 13*b* can be varied by manipulating the variable resistor VR. As a consequence, the stereophonic enhancement effect can be varied.

The adders 14*a* and 14*b* correspond to third calculating means and fourth calculating means, respectively. The adder 14*a* is connected so as to subtract the signal of the operational amplifier OP1 from the signal of the attenuator 13*a*. The adder 14*b* is connected so as to subtract the signal of the operational amplifier OP2 from the signal of the attenuator 13b.

Figure 11:
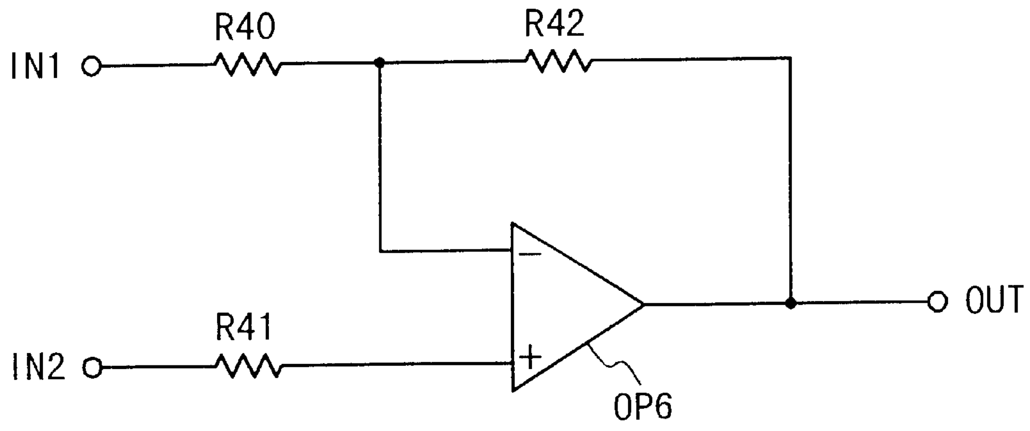
FIG. 11 is a circuit diagram of adders 14*a* and 14*b* employed in the stereophonic sound image enhancement apparatus of FIG. 6.

The adder 14*a* comprises the same circuit arrangement as that of the adder 14*b*, which is shown in detail in FIG. 11. Each of the adders 14*a* and 14*b* comprises resistors R40 to R42, and an operational amplifier OP6. One input signal IN1 is supplied via the resistor R40 to an inverting input terminal (−) of the operational amplifier OP6, and the other input terminal IN2 is supplied via the resistor R41 to a non-inverting input terminal (+) of the operational amplifier OP6. A signal derived from the operational amplifier OP6 is externally outputted as an output signal OUT, and also is fed back via the resistor R42 to the inverting input terminal. A signal outputted from the adder 14*a* is outputted via a filter circuit constructed of a capacitor C2 and a resistor R5 to the external circuit as a left channel output signal "Lout". Also, a signal outputted from the adder 14*b* is outputted via a filter circuit constructed of a capacitor C3 and a resistor R6 to the external circuit as a right channel output signal "Rout".

When the left channel output signal Lout is supplied to the left speaker and the right channel output signal Rout is supplied to the right speaker, the sound images can be localized not only between the left speaker and the right speaker, but also in a wide range around a listener. As a consequence, the stereophonic sound image can be greatly enhanced.

As previously described, in accordance with this embodiment, the inputted sound source can be reproduced without any acoustic, or audible problem during the two-channel speaker reproducing operation, while the sound quality deterioration is suppressed. For example, in the case where sounds based on wind instruments and strings were reproduced, the apparatus provides sufficiently broad sound that may be heard in such a way that the listener is wrapped by the sounds. Also, as indicated in FIG. 6 to FIG. 11, since the circuit of this stereophonic sound image enhancement apparatus is arranged by the operational amplifiers, the capacitors, and the resistors, the stereophonic sound image enhancement apparatus may be constructed in a simple manner and at low cost.

Figure 13:
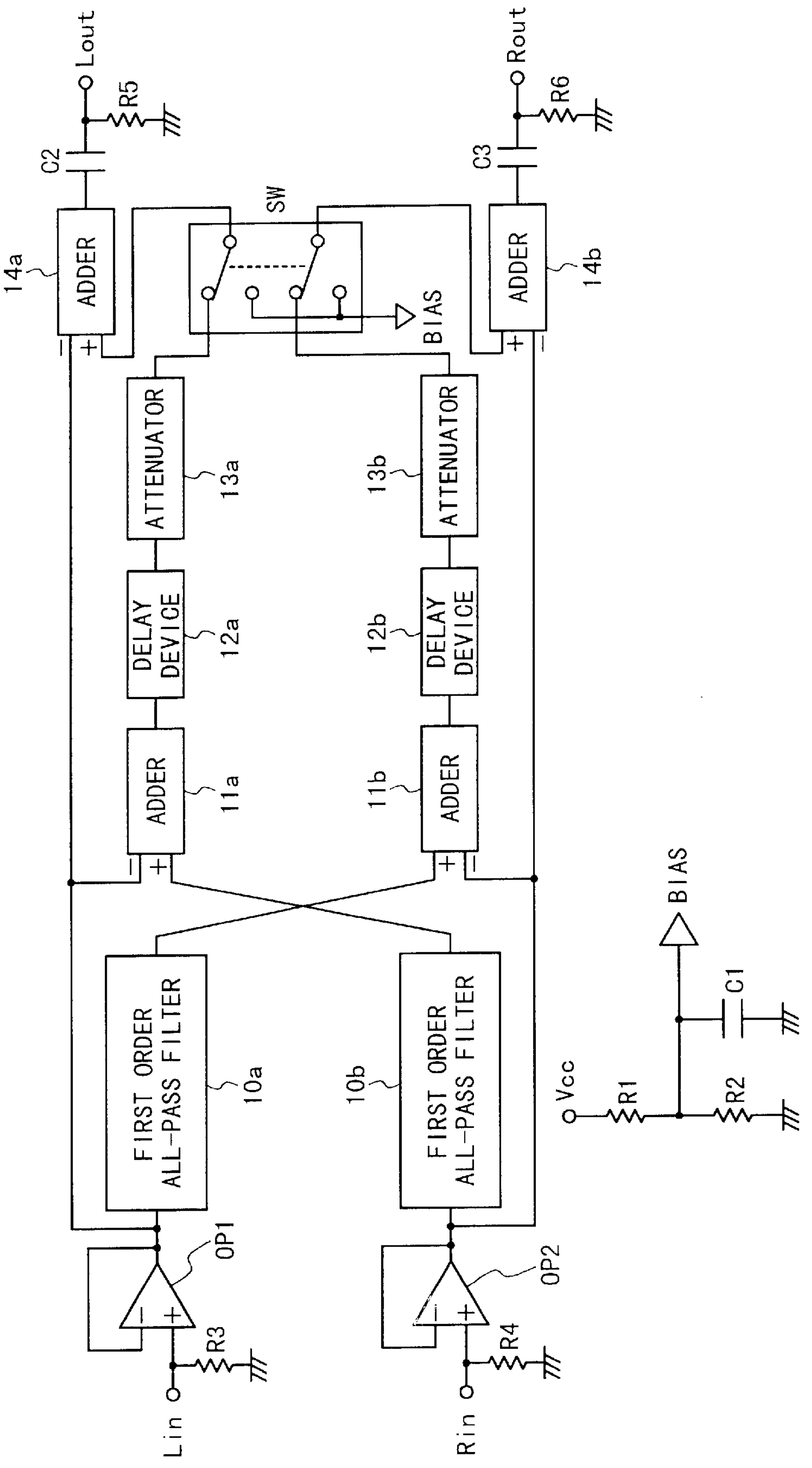
FIG. 13 is a schematic block diagram for indicating an arrangement of a stereophonic sound image enhancement apparatus according to a modification of FIG. 6.

It should be understood that the above-explained stereophonic sound image enhancement apparatus according to this embodiment may be modified, as represented in a circuit block diagram of FIG. 13. That is, in this modified stereophonic sound image enhancement apparatus, a switch SW is added to the circuit arrangement shown in FIG. 6. The signal derived from the attenuator 13*a* may be supplied via the switch SW to the adder 14*a*, whereas the signal derived from the attenuator 13*b* may be supplied via the switch SW to the adder 14*b*. That is, this switch owns two contacts, which are opened/closed together in response to manipulations of a single knob (now shown).

When this switch SW is turned OFF, since the bias voltage BIAS is applied to the adders 14*a* and 14*b*, both the left channel input signal Lin and the right channel input signal Rin are outputted as the left channel output signal Lout and the right channel output signal Rout without being processed to the external circuit. As a result, the stereophonic sound image enhancement effect is not applied. On the other hand, when the switch SW is turned ON, since the signals derived from the attenuators 13*a* and 13*b* are supplied to the adders 14*a* and 14*b*, a signal process operation similar to the above-described signal process operation is executed to the left channel input signal Lin and the right channel input signal Rin. As a result, these processed signals are outputted as the left channel output signal Lout and the right channel output signal Rout to the external circuit. In this case, as explained above, the stereophonic sound image enhancement effect is applied.

In accordance with this circuit arrangement, the stereophonic sound image enhancement apparatus can be controlled as to whether or not the stereophonic sound image enhancement effect is activated by merely turning ON/OFF the switch SW. As a consequence, the stereophonic sound image enhancement effect can be applied, depending upon favorable aspects of listeners and the types of sound sources.

In the above-described embodiment, the first order all-pass filters are employed as the first and second all-pass filters 10*a* and 10*b*. Alternatively, a second order all-pass filter may be used instead of this first order all-pass filter. In this alternative case, similar effects/operations to those of the first order all-pass filters may be achieved.

Also, in the above-explained embodiment, the stereophonic sound image enhancement apparatus is constructed by employing an analog circuit. Alternatively, a digital circuit may be employed to construct this stereophonic sound image enhancement apparatus. In this digital circuit case, the first order all-pass filters 10*a* and 10*b*; the adders 11*a*, 11*b*, 14*a* and 14*b*; the delay devices 12*a* and 12*b*; and the attenuations 13*a* and 13*b* may be realized by, for example, a software processing operation with employment of a DSP and a CPU. In particular, both the delay devices 12*a* and 12*b* may comprise a cyclic buffer capable of writing data while cycling within a predetermined storage region. In this cyclic buffer, input data is written into a top storage position of the cyclic buffer, and the data which was written in the past is read out from a storage position corresponding to the delay amount of this cyclic buffer. As a result, the function capable of delaying the entered data may be realized.

Figure 12:
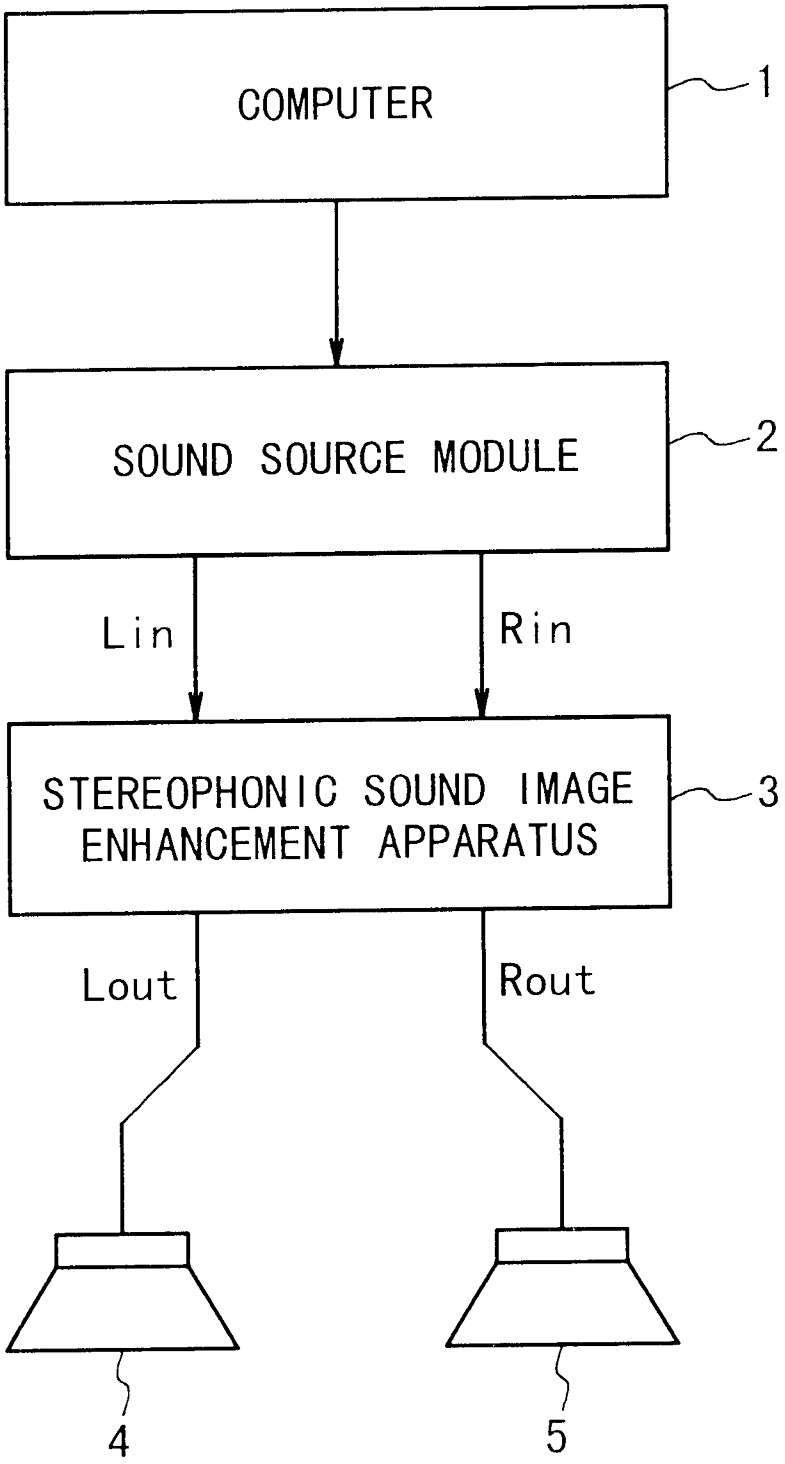
FIG. 12 schematically indicates an arrangement of an application apparatus to which the stereophonic sound image enhancement apparatus of the present invention, shown in FIG. 6 is applied.

Next, a description will now be made of an example of a sound image enhancement system using the above-explained stereophonic sound image enhancement apparatus with reference to FIG. 12. This sound image enhancement system comprises a computer 1, a sound source module 2, a stereophonic enhancement apparatus 3, and speakers 4 and 5. The computer 1 sends MIDI data to the sound source module 2. The sound source module 2 produces a left channel input signal Lin and a right channel input signal Rin in response to the received MIDI data. The left channel input signal Lin and the right channel input signal Rin are supplied to the stereophonic sound image enhancement apparatus 3. Then, in this stereophonic sound image enhancement apparatus 3, since the above-described process operation is carried out, both a left channel output signal Lout and a right channel output signal Rout are produced. Then, the left channel output signal Lout and right channel output signal Rout are supplied to the left channel speaker 4 and the right channel speaker, respectively. A sound image formed by sounds produced from the left/right channel speakers 4/5 is localized outside these speakers 4 and 5, and further a stereophonic sound image is enhanced.

Alternatively, for instance, the stereophonic sound image enhancement apparatus may be provided with respect to each of the sound parts. Then, left channel output signals Lout and right channel output signals Rout produced from the respective sound parts are mixed with respect to each of these channels, and the mixed output signals are outputted. In this alternative arrangement, the stereophonic sound images may be enhanced with respect to the respective sound parts.

It should be noted that this sound image enhancement system is arranged by transmitting the MIDI data from the computer 1 to the sound source module 2. The present invention is not limited to MIDI data. For example, various types of musical sound control data capable of controlling musical sounds may be employed. Instead of the computer 1, various types of apparatus capable of generating musical sound control data may be employed, for instance, an electronic musical instrument, and a sequencer. Furthermore, the apparatus capable of producing the left channel input signal Lin and right channel input signal Rin is not limited to the sound source module. Instead of the sound source module, for instance, an electronic musical instrument, a game machine, or an acoustic appliance may be utilized.

As previously described in detail, in accordance with the present invention, the stereophonic sound image enhancement apparatus and the stereophonic sound image enhancement method can be made in low cost and with the simple circuit arrangement, while the stereophonic sound image can be enhanced without deteriorating the sound quality.

What is claimed is:

1. A stereophonic sound image enhancement apparatus comprising:

a first filter for changing a phase of a left channel input signal in response to a frequency of said left channel input signal to output a phase-changed left channel input signal;

a second filter for changing a phase of a right channel input signal in response to a frequency of said right channel input signal to output a phase-changed right channel input signal;

first calculating means for calculating a first difference between said left channel input signal and said phase-changed right channel input signal outputted from said second filter to output a first difference signal corresponding to said first difference; and second calculating means for calculating a second difference between said right channel input signal and said phase-changed left channel input signal outputted from said first filter to output a second difference signal corresponding to said second difference;

first delay means for delaying said first difference signal outputted from said first calculating means to output a delayed first difference signal as a third difference signal;

third calculating means for subtracting said left channel input signal from said third difference signal outputted from said first delay means to obtain a difference signal which is outputted as a left channel output signal; second delay means for delaying said second difference signal outputted from said second calculating means to output a delayed second difference signal as a fourth difference signal; and fourth calculating means for subtracting said right channel input signal from said fourth difference signal outputted from said second delay means to obtain another difference signal which is outputted as a right channel output signal.

2. A stereophonic sound image enhancement apparatus according to claim 1, wherein:

said first delay means comprises a first delay buffer for delaying said first difference signal outputted from said first calculating means by way of a software process operation; and said second delay means comprises a second delay buffer for delaying said second difference outputted from said second calculating means by way of a software process operation.

3. A stereophonic sound image enhancement apparatus according to claim 1, wherein:

said first delay means comprises a first group delay equalizer for delaying said first difference signal outputted from said first calculating means; and said second delay means comprises a second group delay equalizer for delaying said second difference signal outputted from said second calculating means.

4. A stereophonic sound image enhancement apparatus according to claim 3, wherein:

each of said first group delay equalizer and said second group delay equalizer comprises an all-pass filter.

5. A stereophonic sound image enhancement apparatus according to claim 1, wherein:

each of said first filter and said second filter comprises a first order all-pass filter.

6. A stereophonic sound image enhancement apparatus according to claim 1, wherein:

said first calculating means subtracts said left channel input signal from said phase-changed right channel input signal outputted from said second filter to obtain said first difference signal; and said second calculating means subtracts said right channel input signal from said phase-changed left channel input signal outputted from said first filter to obtain said second difference signal.

7. A stereophonic sound image enhancement apparatus comprising:

a first filter for changing a phase of a left channel input signal in response to a frequency of said left channel input signal to output a phase-changed left channel input signal;

a second filter for changing a phase of a right channel input signal in response to a frequency of said right channel input signal to output a phase-changed right channel input signal;

first calculating means for calculating a first difference between said left channel input signal and said phase-changed right channel input signal outputted from said second filter to output a first difference signal corresponding to said first difference; and second calculating means for calculating a second difference between said right channel input signal and said phase-changed left channel input signal outputted from said first filter to output a second difference signal corresponding to said second difference;

first delay means for delaying said first difference signal outputted from said first calculating means to output a delayed first difference signal as a third difference signal;

first attenuating means for attenuating said third difference signal outputted from said first delay means to supply an attenuated third difference signal as a fifth difference signal;

third calculating means for subtracting said left channel input signal from said fifth difference signal outputted from said first attenuating means to obtain a difference signal which is outputted as a left channel output signal;

second delay means for delaying said second difference signal outputted from said second calculating means to output a delayed second difference signal as a fourth difference signal;

second attenuating means for attenuating said fourth difference signal outputted from said second delay means to supply an attenuated fourth difference signal as a sixth difference signal; and fourth calculating means for subtracting said right channel input signal from said sixth difference signal outputted from said second attenuating means to obtain another difference signal which is outputted as a right channel output signal.

8. A stereophonic sound image enhancement apparatus according to claim 7, wherein:

each of said first attenuating means and said second attenuating means comprises a variable resistor.

9. A stereophonic sound image enhancement apparatus according to claim 7, wherein:

said first delay means comprises a first delay buffer for delaying said first difference signal outputted from said first calculating means by way of a software process operation; and said second delay means comprises a second delay buffer for delaying said second difference outputted from said second calculating means by way of a software process operation.

10. A stereophonic sound image enhancement apparatus according to claim. 7, wherein:

said first delay means comprises a first group delay equalizer for delaying said first difference signal outputted from said first calculating means; and said second delay means comprises a second group delay equalizer for delaying said second difference signal outputted from said second calculating means.

11. A stereophonic sound image enhancement apparatus according to claim 10, wherein:

each of said first group delay equalizer and said second group delay equalizer comprises an all-pass filter.

12. A stereophonic sound image enhancement apparatus according to claim 7, wherein:

each of said first filter and said second filter comprises a first order all-pass filter.

13. A stereophonic sound image enhancement apparatus according to claim 7, wherein:

said first calculating means subtracts said left channel input signal from said phase-changed right channel input signal outputted from said second filter to obtain said first difference signal; and said second calculating means subtracts said right channel input signal from said phase-changed left channel input signal outputted from said first filter to obtain said second difference signal.

14. A stereophonic sound image enhancement apparatus according to claim 7, further comprising:

switch means controlled as to determine whether or not said fifth difference signal outputted from said first attenuating means is supplied to said third calculating means, and said sixth difference signal outputted from said second attenuating means is supplied to said fourth calculating means.

15. A stereophonic sound image enhancement method comprising the steps of:

changing a phase of a left channel input signal in response to a frequency of said left channel input signal to output a phase-changed left channel input signal;

changing a phase of a right channel input signal in response to a frequency of said right channel input signal to output a phase-changed right channel input signal;

calculating a first difference between said left channel input signal and said phase-changed right channel input signal to output a first difference signal corresponding to said first difference;

calculating a second difference between said right channel input signal and said phase-changed left channel input signal to output a second difference signal corresponding to said second difference;

producing a third difference signal by delaying said first difference signal;

subtracting said left channel input signal from said produced third difference signal to obtain a difference signal which is outputted as a left channel output signal;

producing a fourth difference signal by delaying said second difference signal; and subtracting said right channel input signal from said produced fourth signal to obtain another difference signal which is outputted as a right channel output signal.

16. A stereophonic sound image enhancement method comprising the steps of:

changing a phase of a left channel input signal in response to a frequency of said left channel input signal to output a phase-changed left channel input signal;

changing a phase of a right channel input signal in response to a frequency of said right channel input signal to output a phase-changed right channel input signal;

calculating a first difference between said left channel input signal and said phase-changed right channel input signal to output a first difference signal corresponding to said first difference;

calculating a second difference between said right channel input signal and said phase-changed left channel input signal to output a second difference signal corresponding to said second difference;

producing a third difference signal by delaying said first difference signal;

producing a fourth difference signal by delaying said second difference signal;

producing a fifth difference signal by attenuating said third difference signal, subtracting said left channel input signal from said fifth difference signal to calculate another difference signal, and outputting said calculated difference signal as a left channel output signal; and producing a sixth difference signal by attenuating said fourth difference signal, subtracting said right channel input signal from said sixth difference signal to calculate another difference signal, and outputting said calculated difference signal as the left channel output signal as a right channel output signal.

* * * * *

UNITED STATES PATENT AND TRADEMARK OFFICE
CERTIFICATE OF CORRECTION

PATENT NO. : 6,507,657 B1
DATED : January 14, 2003
INVENTOR(S) : Kenji Kamada et al.

It is certified that error appears in the above-identified patent and that said Letters Patent is hereby corrected as shown below:

<u>Title page,</u>
Item [57], ABSTRACT,
Line 13, delete "." between the words "output" and "the".

<u>Drawings</u>
Sheet 8, Figure 9, replace "ARRANGMENT" for -- ARRANGEMENT --.
Sheet 8, Figure 10, replace "ATTENUATIOR" for -- ATTENUATOR --.
Sheet 9, Figure 11, replace "ARRENGEMENT" for -- ARRANGEMENT --.

<u>Column 13,</u>
Line 12, delete "." between the words "claim" and "7".

Signed and Sealed this

Third Day of August, 2004

JON W. DUDAS
*Acting Director of the United States Patent and Trademark Office*